(12) United States Patent
Tsuchida

(10) Patent No.: US 6,360,060 B1
(45) Date of Patent: Mar. 19, 2002

(54) CAMERA

(75) Inventor: Keiichi Tsuchida, Fuchu (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/574,618

(22) Filed: May 19, 2000

(30) Foreign Application Priority Data

May 20, 1999 (JP) ............................................ 11-140626
May 20, 1999 (JP) ............................................ 11-140627

(51) Int. Cl.[7] ............................................. G03B 15/05
(52) U.S. Cl. ....................... 396/176; 396/206; 396/542
(58) Field of Search ............................... 396/176, 205, 396/206, 542

(56) References Cited

U.S. PATENT DOCUMENTS 5,943,510 A * 8/1999 Wacht et al. ............ 396/542 X
6,160,958 A * 12/2000 Manico et al. .......... 396/176 X
6,219,495 B1 * 4/2001 Miyamoto et al. .......... 396/542

FOREIGN PATENT DOCUMENTS

JP 06-222432 * 8/1994

* cited by examiner

Primary Examiner—W. B. Perkey
(74) Attorney, Agent, or Firm—Frishauf, Holtz, Goodman, Langer & Chick, P.C.

(57) ABSTRACT

The camera includes a printed wiring board on which electric parts are mounted, a strobe light emission part which emits and projects a lighting light toward an object to be photographed, and a planar capacitor which stores light emitting energy for the strobe light emission part. A planar portion of the planar capacitor which faces toward the printed wiring board is arranged parallel to and fixedly secured to the printed wiring board.

20 Claims, 4 Drawing Sheets

CAMERA

This application claims the benefit of Japanese Patent Application No.H11-140626 filed in Japan on May 20, 1999 and Japanese Patent Application No.H11-140627 filed in Japan on May 20, 1999, the contents of which are incorporated by reference.

BACKGROUND OF THE INVENTION

1. Field of the Invention

This invention relates to a camera having a strobe light emission part, and more particularly to shapes and arrangement of a printed wiring board on which control means for performing drive controls of various operating functions of the camera and a drive power capacitor which generates and supplies light emission driving power to the strobe light emission part.

2. Related Art Statement

Conventionally, in the field of small-sized compact cameras having a strobe light emission part and a lens shuttering function, it is an essential factor for making a camera compact that a strobe light emission capacitor, which generates and supplies light emission driving power to the strobe light emission part, make thin and compact. Several proposals have been made with respect to the shapes and the arrangement of the strobe light emission capacitor.

For example, as described in Japanese Laid-Open Patent Publication H06-222432/1994, to ensure sufficient electric energy for driving strobe light emission supplied to a strobe light emission part and to ensure an efficient arrangement space of the strobe light emission capacitor disposed in the inside of the camera, two strobe light emission capacitors are provided and these two capacitors are juxtaposed at a given interval in the thickness direction of the camera, and a light emission circuit board on which a plurality of light emission electric parts are mounted to be positioned between the capacitors is disposed along the capacitors.

In this Japanese Laid-Open Patent Publication H06-222432/1994, with the use of two capacitors, the electric energy for strobe light emission is ensured and a space between two capacitors which may form an unused space is made use of by arranging the strobe light emission electric parts mounted on the light emission circuit board in the space.

However, with the use of two strobe light emission capacitors, it becomes necessary to provide at least an arrangement space necessary for arranging these two capacitors in the thickness direction of the camera and this becomes an obstacle for making the camera thin in the thickness direction.

Further, in general, a controlling and driving circuit board mounts various electric components which constitute a control circuit for controlling and driving various operating functions such as the shutter speed, the exposure, and the adjustment of focusing thereon. Such a controlling and driving circuit board is disposed at a given position in the inside of a camera housing in such a manner that the controlling and driving circuit board is covered by a noise blocking shield so as to avoid malfunctions caused by external noise.

The provision of such a noise blocking shield of the circuit board, however, obstructs the camera from becoming thin and compact due to the necessity for ensuring and setting the arrangement position and the arrangement space of the circuit board in the inside of the camera housing.

OBJECTS AND SUMMARY OF THE INVENTION

It is a first object of the present invention to provide a driving electric energy capacitor for generating and supplying light emitting driving electric power to a printed wiring board on which control means for driving and controlling various functions of a camera are mounted.

It is a second object of the present invention to provide a printed wiring board and a driving electric energy capacitor for strobe light emission which enable the camera to become thin and compact.

In summary, a camera of the present invention includes a printed wiring board on which electric parts are mounted, a strobe light emission part which emits and projects a lighting light to an object to be photographed, and a planar capacitor which stores light emitting energy for the strobe light emission part, wherein a planar portion of the planar capacitor is arranged parallel to and is fixedly secured to the printed wiring board.

These objects and advantages of the present invention will become further apparent from the following detailed explanation.

DETAILED DESCRIPTION OF THE PREFERRED EMBODIMENTS

Embodiments of the present invention are explained hereinafter in conjunction with the drawings.

Figure 1:
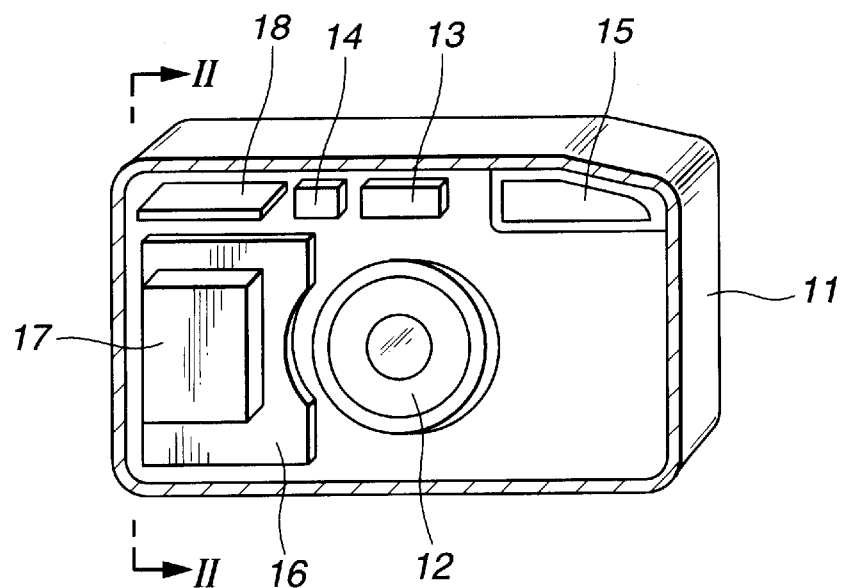
FIG. 1 is a perspective view of a camera of the first embodiment of the present invention as seen from an oblique front portion by cutting off a portion of the housing of the camera.
Figure 2:
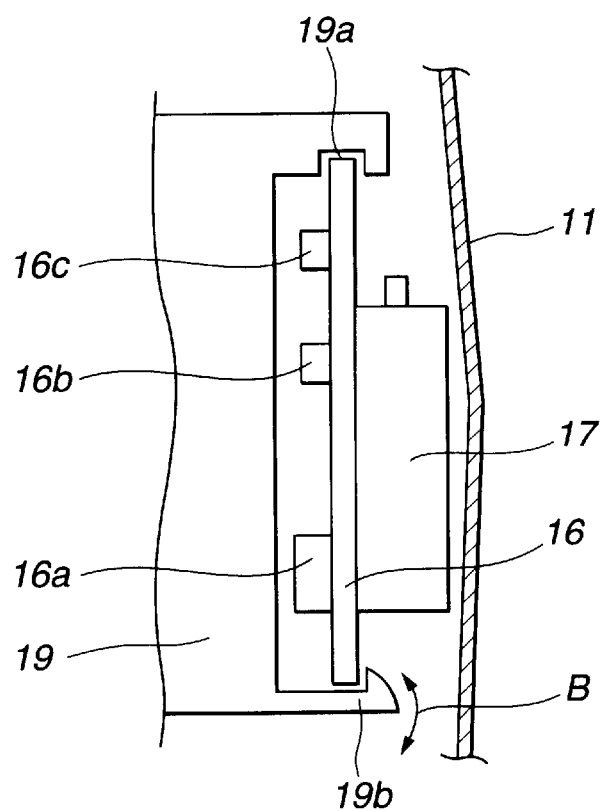
FIG. 2 is a cross-sectional view of the camera shown in FIG. 1 taken along line II—II in FIG. 1.
Figure 3:
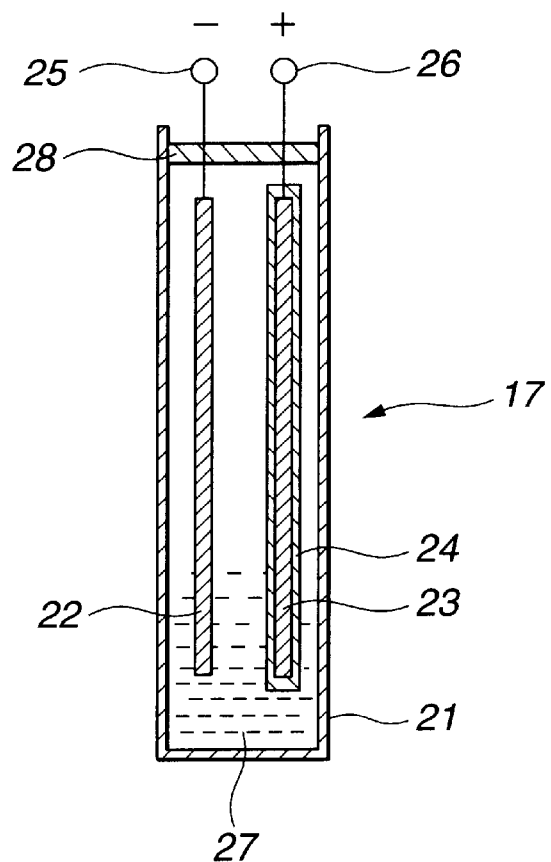
FIG. 3 is a cross-sectional view showing a capacitor used as a drive power source of a strobe light emission part of the camera of the first embodiment.

FIG. 1 is a perspective view of a camera of the first embodiment of the present invention as seen from an oblique front portion by cutting off a portion of the housing of the camera, FIG. 2 is a cross-sectional view of the camera shown in FIG. 1 taken along line II—II in FIG. 1, and FIG. 3 is a cross-sectional view showing a capacitor used as a drive power source of a strobe light emission part of the camera of the first embodiment.

As shown in FIG. 1, in the camera of the first embodiment, a lens barrel 12 which incorporates a taking lens with a built-in shutter function is disposed at a central portion of a front surface of a portion of the housing 11 of the camera. Above this lens barrel 12, a finder 13 through which a photographer observes an object to be photographed, a distance measuring means 14 which measures the distance from the camera to the object to be photographed, and a strobe light emission part 15 which emits lighting light toward the object to be photographed are disposed.

Further, in the inside of the camera, a main printed wiring board 16 which mounts a control circuit for controlling various operations of the camera is arranged at the left side of the lens barrel 12 within the portion of the housing 11 in the drawing. On this main printed wiring board 16, the control circuit which performs a drive control of the lens barrel 12, a distance measurement control of the distance measuring means 14, an exposure control of a release switch not shown in the drawing and a winding and unwinding drive control of a film and the like is mounted.

Further, above the main printed wiring board 16, a strobe printed wiring board 18 on which a drive control circuit of the strobe light emission part 15 is disposed. Still further, the camera is provided with a capacitor 17 which stores driving power energy for strobe light emission supplied to the strobe light emission part 15 by way of the strobe printed wiring board 18.

As shown in FIG. 2, the main printed wiring board 16 is disposed perpendicularly or vertically in the height direction in the inside of the portion of the housing 11 as seen from a position right in front of the camera. The main printed wiring board 16 is fixedly secured by means of a board fixing fitting groove 19a and a board fixing engaging member 19b which are extended from an inner casing 19 disposed in the inside of the portion of the housing 11. That is, the main printed wiring board 16 has an upper end thereof fitted into the board fixing fitting groove 19a and a lower end portion thereof engaged with the board fixing engaging member 19b.

As shown in the drawing, the board fixing engaging member 19b has an inclined surface at a distal end portion thereof and is tilted in an arrow direction B so as to fixedly secure the lower end of the main printed wiring board 16.

Further, in addition to the above-mentioned respective circuits, various operation control parts of the camera are electrically connected to the main printed wiring board 16 and the strobe printed wiring board 18.

The capacitor 17 is controlled by a charging and discharging circuit mounted on the strobe printed wiring board 18 and stores electric power energy for strobe light emission and supplies the stored electric power energy to the strobe light emission part 15.

Further, as seen from a position in front of the camera, the capacitor 17 is disposed in front of the main printed wiring board 16 and at the at the side of the housing 11. Still further, as shown in FIG. 3, the capacitor 17 is a so-called electrolytic capacitor exhibiting a cross section of a thin rectangular plate-like shape. In a space defined in the inside of a case 21 formed of aluminum or the like by molding, a cathode electrode 22 and an anode electrode 23 are disposed such that they face each other in an opposed manner.

Although the cathode electrode 22 and the anode electrode 23 are formed of aluminum material by molding, an electrode which has a surface thereof transformed into a dielectric film 24 by an electrolytic oxidation treatment is used as the anode electrode 23. In the inside of the case 21 in which the cathode electrode 22 and the anode electrode 23 having the oxidized dielectric film 24 are inserted, an electrolytic solution 27 is filled. On an upper surface of the case 21, a cap 28 for sealing the electrolytic solution is mounted so as to hermetically seal the case 21 per se. A cathode terminal 25 and an anode terminal 26 which pass through the sealing cap 28 are respectively connected to the cathode electrode 22 and the anode electrode 23 having the oxidized dielectric film 24.

Figure 3A:
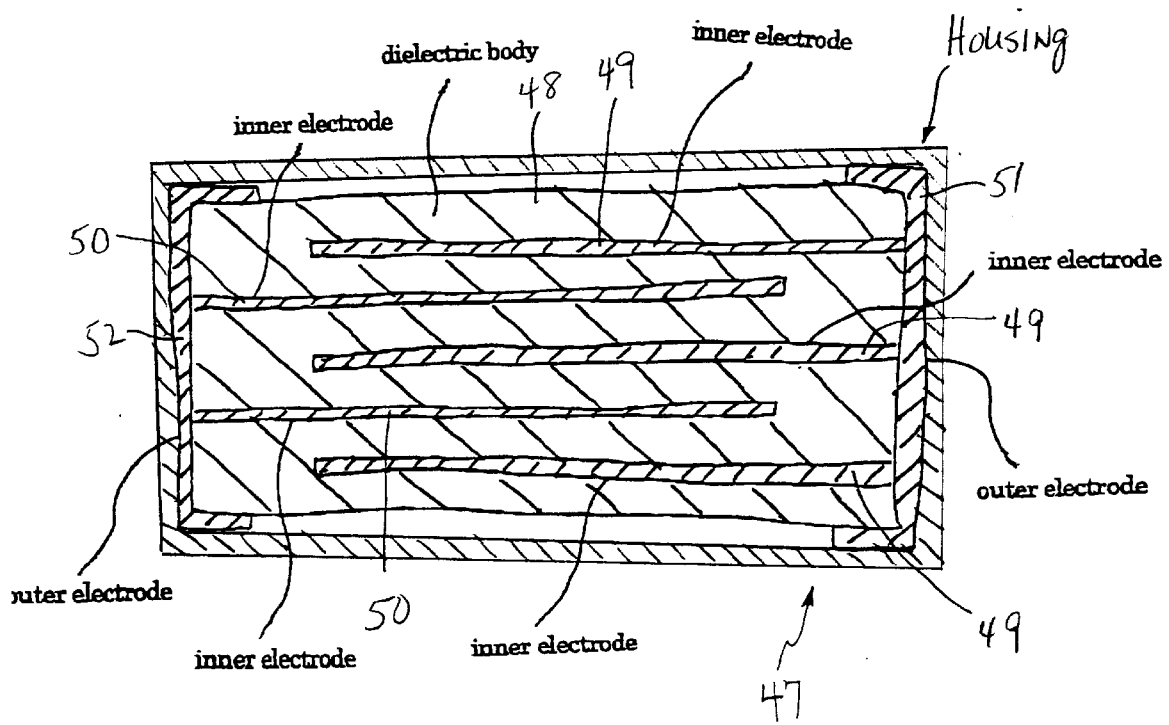
FIG. 3A is a cross-sectional view of another type of capacitor used as a drive power source of a strobe light emission part.

As shown in FIG. 3A, a thin capacitor 47 having a laminated structure formed by laminating dielectric bodies 48 and inner electrodes 49, 50, connected respectively to outer electrodes 51, 52 may be used in place of the capacitor 17. A housing 53 surrounds the dielectric bodies and electrodes of the capacitor.

In this manner, the capacitor 17, 47 adopted by this embodiment assumes a planar rectangular shape which has a thin thickness and a wide planar area as an outer contour thereof.

Throughout the following, reference to capacitor 17 includes reference to the alternative capacitor 47 of FIG. 3A.

Further, the capacitor 17 is fixedly secured by adhesion to one of the surfaces of the main printed wiring board 16 which is a surface on which various electric parts 16a–16c of the main printed wiring board 16 are not mounted. Although not shown in the drawing, on the surface on which various electric parts 16a–16c of the main printed wiring board 16 are not mounted, a circuit pattern which is connected with the electric parts 16a–16c is formed. After completing the connection of the circuit pattern and the electric parts 16a–16c, an electrical insulation treatment is applied and then the capacitor 17 is fixedly secured by adhesion to the surface of the main printed wiring board 16.

Instead of directly adhering and securing the capacitor 17 to the main printed wiring board 16, the capacitor 17 may be disposed parallel to the main printed wiring board 16 with a slight gap therebetween. In this case, in fixedly securing the capacitor 17 to the main printed wiring board 16 while disposing the capacitor 17 parallel to the main printed wiring board 16, a fitting groove and an engaging member similar to the previously mentioned board fixing fitting groove 19a and the board fixing engaging member 19b which are extended from the inner casing 19 may be provided for fixedly securing the capacitor 17 to the main printed wiring board 16.

In mounting the main printed wiring board 16 and the capacitor 17 on the inner casing 19 in the inside of the housing 11, the previously mentioned board fixing fitting groove 19a and the board fixing engaging member 19b are not necessarily used and screws or an adhesive agent may be used.

In this manner, by disposing the capacitor 17 vertically or perpendicularly in the height direction of the camera from a position in front of the front surface of the inside of the housing 11 to the front-surface-side inside of the housing 11 of the camera and disposing the main printed wiring board 16 at the rear surface side of the capacitor 17 parallel to the capacitor 17, the arrangement space of the main printed wiring board 16 and the capacitor 17 in the inside of the camera becomes a space having a thickness which is an addition of the thickness of the main printed wiring board 16 on which electric parts 16a–16c are mounted and the thickness of the capacitor 17 so that the depth size of the camera can be made thin.

Further, in this embodiment, the capacitor 17 is disposed in front of the main printed wiring board 16 as seen from a position in front of the camera and the packaging case 21 of the capacitor 17 is grounded. Due to such a constitution, external noises which are incident from the front surface of the camera can be shielded in a wide range by this capacitor 17 (which is grounded). Accordingly, it gives rise to an advantage that it is not necessary to separately or additionally arrange a shield for blocking external noises to the main printed wiring board 16.

In assuming a camera for general use, a film winding space which accommodates a film spool is formed at the rear surface side of the inside of the package 11 where the capacitor 17 and the main printed wiring board 16 are disposed. In this embodiment, the film winding space and the portion where the main printed wiring board 16 and the capacitor 17 are accommodated, are isolated by an isolation member. By adhering a shield film to this isolation member or forming the isolation member per se with a material in which an electric conductive material is mixed, external noises from the rear surface of the camera can be blocked.

In the above-mentioned embodiment, although the capacitor 17 is disposed at the housing 11 side of the front surface of the camera, the main printed wiring board 16 may be disposed at the housing 11 side of the front surface of the camera and the capacitor 17 may be disposed at the rear surface side of the main printed wiring board 16. In this case, external noises from the rear surface side of the camera can be blocked by the capacitor 17 (due to the reason set forth previously). To cope with external noises from the front surface of the camera, a shield may be adhered to the inside of the housing 11 of the surface of the camera or the housing may be formed of a housing material into which an electrically conductive material is mixed.

Figure 4:
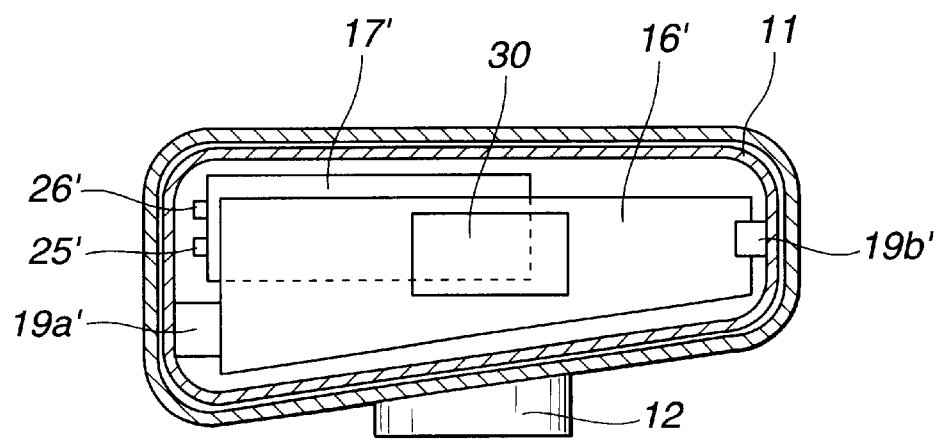
FIG. 4 is a view of a camera of the second embodiment of the present invention as seen from an upper position by cutting off a portion of the housing of the camera.

Now a, second embodiment of the camera according to the present invention is explained in conjunction with FIG. 4. FIG. 4 shows the camera of the second embodiment as seen from an upper position by cutting off a portion of the housing of the camera. The same numerals are given to the same parts shown in FIG. 1.

With respect to the camera of the second embodiment, in the inside of a housing 11 of the camera, a main printed wiring board 16' which is similar to the main printed wiring board 16 is disposed. That is, the main printed wiring board 16' is fixedly secured by means of a board fixing fitting groove 19a' and a board fixing engaging member 19b' which are extended from an inner casing 19 in the horizontal direction as seen from an upper surface of the housing 11 of the camera.

As shown in the drawing, with respect to the main printed wiring board 16', a capacitor 17' having a thin plate shape similar to that of the capacitor 17 is fixedly secured by adhesion to the lower side of the main printed wiring board 16'.

In the drawing, numeral 30 disposed above the upper surface side of the main printed wiring board 16' indicates a display means which includes by a liquid crystal element or the like which displays the number of film photographing frames, date and time, various photographing modes and the like.

In this manner, the main printed wiring board 16' and the capacitor 17' are disposed at an upper surface of the housing 11 of the camera and hence, the reduction of the size of the camera in the height direction becomes possible, thus providing a further compact camera. Further, the capacitor 17' can shield external noises as in the case of the first embodiment so that a camera having improved noise blocking property characteristics can be provided.

Although the mounting position of the capacitor 17' is arranged at the lower surface side of the main printed wiring board 16' in the second embodiment, it is apparent that an effect similar to the previously mentioned effect can be also obtained by arranging the capacitor 17' at the upper surface side of the main printed wiring board 16'.

Figure 5:
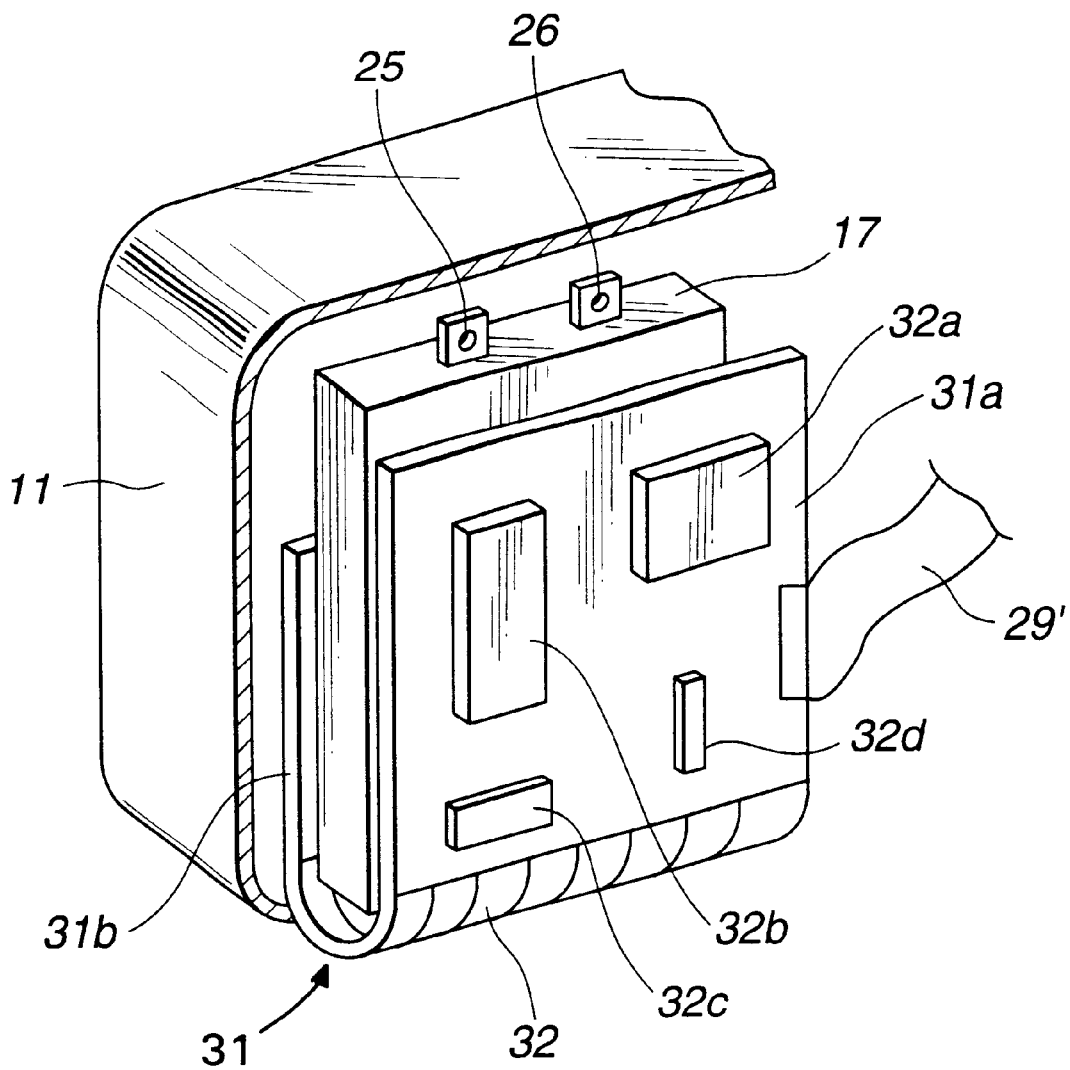
FIG. 5 is a perspective view of a camera of the third embodiment of the present invention as seen from an oblique front position by cutting off a portion of the housing of the camera.

Subsequently, the third embodiment of the present invention is explained in conjunction with FIG. 5. FIG. 5 is a perspective view of the camera of the third embodiment of the present invention as seen from an oblique front position by cutting off a portion of the housing of the camera.

The difference between the first embodiment shown in FIG. 1 and the third embodiment shown in FIG. 5 lies in that a new main printed wiring board 31 is used in place of the above-mentioned main printed wiring board 16. This new main printed wiring board 31 is constructed by integrally forming a first printed wiring board portion 31a having a bent portion 32 and a second printed wiring board portion 31b.

In the third embodiment, as in the case of the electric parts and the circuit pattern which are mounted on the main printed wiring board 16 of the first embodiment, electric parts 32a–32d of various operation control circuits and connectors 32e which are connected to various operation switches of the camera and the above-mentioned distance measurement means 14 and the like are mounted on the first printed wiring board portion 31a. Further, on the rear surface of the first printed wiring board portion 31a opposed to the surface on which these parts are mounted, a circuit pattern which connects the electric parts 32a–32d and the connectors 32e is formed.

On the second printed wiring board portion 31b, electric parts and the circuit pattern similar to the electric parts and the circuit pattern (not shown in this drawing in view of the nature of the drawing) mounted on the strobe printed wiring board 18 of the first embodiment are mounted.

As the electric parts and the circuit pattern mounted on the first and second printed wiring board portions 31a, 31b, the electric parts and the circuit pattern on the main printed wiring board portion 16 of the first embodiment are divided and then mounted on the first and second printed wiring board portions 31a, 31b and strobe printed wiring boards 18 may be provided independently corresponding to them.

Further, a connection wiring network which connects the first and second printed wiring board portions 31a, 31b is formed on the bent portion 32. Still further, the main printed wiring board 31 is folded back to the rear surface side at the bent portion 32 and the capacitor 17 is arranged at the rear surface sides of the first printed wiring board portion 31a and the second printed wiring board portion 31b which face each other in an opposed manner.

That is, the capacitor 17 is sandwiched between the first and the second printed wiring board portions 31a, 31b of the main printed wiring board 31 and is arranged at a given position in the inside of the housing of the camera. Further, an insulation treatment is applied to the rear surfaces of the first and second printed wiring board portions 31a, 31b and the capacitor 17 is fixedly secured to the rear surfaces by adhesion.

Due to such a construction, the main printed wiring board 31 and the capacitor 17 can be made thin and the arrangement space thereof can be minimized. Further, the space between the first and second printed wiring board portions 31a, 31b can be shielded by the capacitor 17 and hence, the electric interference between external noises and the first and second printed wiring board portions 31a, 31b can be blocked.

In this third embodiment, the capacitor 17 may be completely sandwiched in the main printed wiring board 31 or may have a portion thereof extended outside from the main printed wiring board 31 provided that the capacitor 17 is arranged in a form which enables the capacitor 17 to block the interference or the like between the first and second printed wiring board portions 31a, 31b.

Further, the main printed wiring board 31 and the capacitor 17 may be fixedly secured to the inside of the housing 11 in such a manner that the main printed wiring board 31 is fixedly secured by means of the board fixing fitting groove 19a and the board fixing engaging member 19b which are extended from the inner casing 19 disposed in the camera shown in FIG. 1. Further, the capacitor 17 may be fixedly secured to the inner casing 19 by means of screws or an adhesive agent. The arrangement and fixing of the main printed wiring board 31 and the capacitor 17 in the inside of the package 11 of the camera in particular, are not limited to the above-mentioned methods.

Still further, the first and second printed wiring board portions 31a, 31b and the bent portion 32 may be integrally formed with the use of a flexible printed wiring board.

As has been described heretofore, the main printed wiring board 16, 31 is juxtaposed to the capacitor 17 of a thin plate shape which supplies the driving electric power to the strobe light emission part 15 and is arranged in the inside of the housing 11 of the camera and hence, the camera can be made small-sized or compact. Further, the capacitor 17 has the function of a shield for blocking external noises and hence, it becomes possible to prevent the mixing of external noises to the main printed wiring board 16, 31.

In the above-mentioned embodiments of the present invention, although the examples where the electric parts 16a–16c, 32a–32d are mounted on one surface of the main printed wiring board 16, 31 and the circuit pattern which connects the electric parts 16a–16c, 32a–32d is mounted on the other surface of the main printed wiring board 16, 31 have been explained, it is apparent that the present invention can adopt a printed wiring board which mounts the electric parts 16a 16c, 32a–32d and the circuit pattern on one surface thereof.

As has been described heretofore, the present invention uses a planar capacitor as the capacitor for strobe driving power which stores driving power for strobe light emission and the printed wiring board on which at least control circuit functions of various operation means are mounted is juxtaposed to the planar capacitor parallel to the capacitor so that the camera can be made thin and compact.

Further, by disposing the planar capacitor at the front side of the housing of the camera, external noises can be blocked and hence, an effect that malfunctions or the like of various operation control circuit functions mounted on the printed wiring board which may be caused by the external noises can be surely prevented.

Still further, by arranging and installing the planar capacitor in such a manner that it is sandwiched by the printed wiring board, the arrangement space of the planar capacitor and the printed wiring board which are arranged in the inside of the cam era can be made small and hence, the present invention can achieve an effect that the mutual interference between the printed wiring boards can be blocked in addition to the effects that the camera can be made thin and compact and the external noises can be blocked.

In the present invention, it is apparent that working modes different in a wide range can be formed on the basis of the present invention without departing from the spirit and the scope of the invention. The present invention is not restricted by any specific embodiments except being limited by the appended claims.

What is claimed is:

1. A camera comprising:
a printed wiring board on which electric parts are mounted,
a strobe light emission part which emits and projects a lighting light toward an object to be photographed and,
a planar capacitor for storing light emitting energy for the strobe light emission part,
wherein a planar portion of the planar capacitor is arranged parallel to and fixedly secured to the printed wiring board.

2. A camera according to claim 1, wherein the printed wiring board and the planar capacitor which are fixedly secured to each other are arranged along a housing member of the camera which faces the object to be photographed in an opposed manner inside of the camera.

3. A camera according to claim 2, wherein the printed wiring board and the planar capacitor which are fixedly secured to each other are arranged approximately parallel to the camera housing member.

4. A camera according to claim 1, wherein the printed wiring board and the planar capacitor which are fixedly secured to each other are arranged approximately perpendicular to the camera housing member which faces the object to be photographed in an opposed manner.

5. A camera according to claim 1, wherein the electric parts are mounted on a surface of the printed wiring board on which the planar capacitor is not arranged.

6. A camera according to claim 1, wherein the planar capacitor is an electrolytic capacitor in which is filled an electrolytic solution along with a cathode electrode and an anode electrode therein.

7. A camera according to claim 1, wherein the planar capacitor is a laminated capacitor which is formed by alternately laminating dielectric bodies and electrodes.

8. A camera according to claim 1, wherein the printed wiring board and the planar capacitor are fixedly secured together by adhesion.

9. A camera according to claim 1, wherein the printed wiring board and the planar capacitor are fixedly secured together by engaging members.

10. A camera according to claim 1, wherein the planar capacitor blocks external noises toward the printed wiring board.

11. A camera comprising:
a printed wiring board on which electric parts are mounted and which is bendable by means of a bent portion,
a strobe light emission part which emits and projects lighting light to an object to be photographed, and
a planar capacitor for storing light emitting energy for the strobe light emission part which is sandwiched by the printed wiring board bent by means of the bent portion.

12. A camera according to claim 11, wherein the printed wiring board comprises a first printed wiring board portion, a second printed wiring board portion and the bent portion which connects the first and second board portions.

13. A camera according to claim 12, wherein a connection wiring network which connects circuit patterns of printed wiring portions of the first and second printed wiring board portions is formed on the bent portion.

14. A camera according to claim 10, wherein the printed wiring board is a flexible board.

15. A camera according to claim 10, wherein the electric parts are arranged on a surface of the printed wiring board by which the planar capacitor is not sandwiched.

16. A method for arranging a planar strobe charging capacitor on a camera comprising:
a first step of fixedly securing a planar portion of a planar capacitor to a printed wiring board on which electric parts are mounted parallel to the printed wiring board, and
a second step of fixedly securing the printed wiring board and the planar capacitor which are fixedly secured to each other in the first step to an inside portion of the camera.

17. A method for arranging a planar strobe charging capacitor on a camera comprising:

a first step of bending a printed wiring board on which electric parts are mounted at a bent portion, a second step of sandwiching and fixedly securing the planar capacitor by the printed wiring board bent in the first step, and a third step of fixedly securing the printed wiring board which sandwiches the planar capacitor to an inside portion of the camera in the second step.

18. A method for arranging a planar strobe charging capacitor on a camera according to claim 17, wherein the printed wiring board comprises a first printed wiring board portion, a second printed wiring board portion and a bent portion which connects the first and second board portions.

19. A method for arranging a planar strobe charging capacitor on a camera according to claim 18, wherein a connection wiring network, which connects circuit patterns of printed wiring portions of the first and second printed wiring portions, is formed on the bent portion.

20. A method for arranging a planar strobe charging capacitor on a camera according to claim 17, wherein the printed wiring board is a flexible board.

* * * * *